United States Patent [19]

Zahn

[11] Patent Number: 4,889,277
[45] Date of Patent: Dec. 26, 1989

[54] METHOD AND APPARATUS FOR SURFACE MOUNTING TERMINALS

[75] Inventor: Irwin Zahn, New York, N.Y.

[73] Assignee: Autosplice, Inc., Woodside, N.Y.

[21] Appl. No.: 11,143

[22] Filed: Feb. 5, 1987

[51] Int. Cl.$^4$ .............................................. B23K 31/02
[52] U.S. Cl. .................................. 228/180.2; 228/6.2;
228/44.7; 228/49.1
[58] Field of Search .................. 228/180.2, 44.7, 180.1,
228/49.1, 6.2; 29/843

[56] References Cited

U.S. PATENT DOCUMENTS

| | | | |
|---|---|---|---|
| 3,846,905 | 11/1974 | Harper | 228/180.2 X |
| 3,972,463 | 8/1976 | Coulon et al. | 228/44.7 |
| 3,977,075 | 8/1976 | Lynch et al. | 228/180.1 X |
| 4,091,529 | 5/1978 | Zaleckas | 29/843 |
| 4,311,266 | 1/1982 | Kondo | 228/180.1 X |
| 4,364,508 | 12/1982 | Lazzery et al. | 228/180.2 X |
| 4,654,502 | 3/1987 | Furtek | 228/180.1 X |

FOREIGN PATENT DOCUMENTS 1600550 10/1981 United Kingdom .................. 228/6.2

OTHER PUBLICATIONS

"Component Attachment Method", IBM Technical Disclosure Bulletin, vol. 29, No. 7, Dec. 1986, pp. 2591-2952.

Primary Examiner—Kenneth J. Ramsey
Assistant Examiner—Carmine Cuda
Attorney, Agent, or Firm—Rosen, Dainow & Jacobs

[57] ABSTRACT

A method and apparatus for surface mounting terminals on a substrate, in particular, pin terminals on a printed circuit board, having solder applied therein. In the first step of the method, a plurality of terminals are inserted in a holding fixture and held in alignment with each other. The holding fixture is then rotated to bring the terminals into contact with the solder on the substrate. In the next step of the method, the area of contact is heated, for example, by infra-red radiation, until reflow of the solder occurs. After heating, the heated solder is allowed to cool, i.e. solidify, thereby forming a secure connection between the terminals and the surface of the substrate.

21 Claims, 8 Drawing Sheets

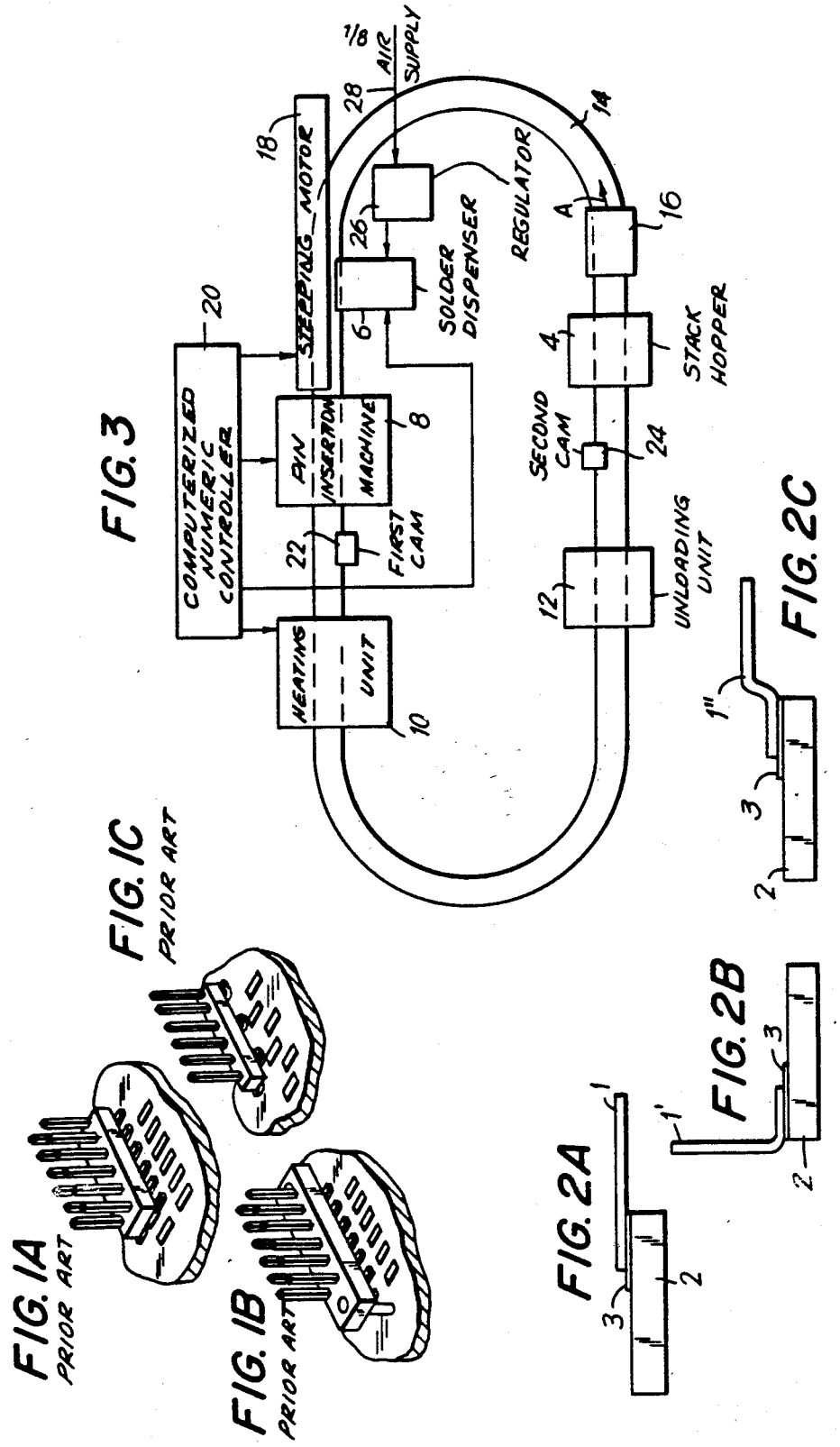

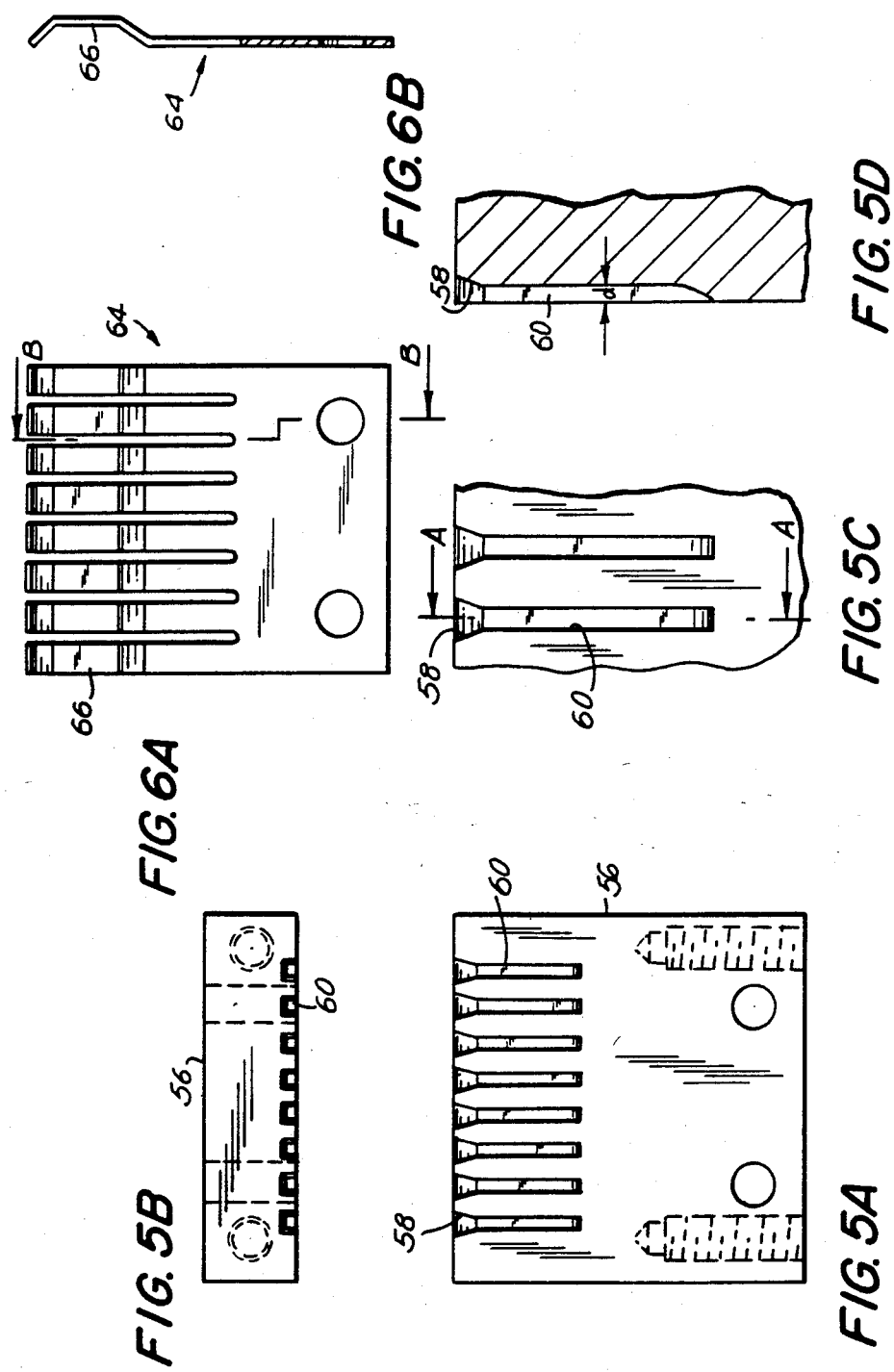

METHOD AND APPARATUS FOR SURFACE MOUNTING TERMINALS

FIELD OF THE INVENTION

This invention relates to a method and apparatus for surface mounting accurately spaced contacts or terminals on a plastic or ceramic substrate, particularly such a substrate of a printed circuit board (PCB), without the necessity of holes and without the use of plastic headers.

BACKGROUND OF THE INVENTION

Present methods of surface mounting pins, tabs or other terminals to substrates are unsatisfactory because they are merely slight modifications to standard present-day headers. In the case of pins, these modifications include alternate bending of pins, in a gull-wing shape or "J" leg, or resort to using plug holes (see FIG. 1).

These solutions are not desirable because they consume too much surface area, are difficult to inspect, require holes, and need expensive pick and place machines together with headers loaded in supply tubes. Another alternative is a lead frame assembly with mounting clip. This solution suffers from several problems, including the severe limitation that the pins can only be located next to the edge of the substrate.

Clearly, the need for a quick and simple system for terminal attachment exists.

SUMMARY OF THE INVENTION

The primary object of the invention is to provide an improved method for surface mounting pins, tabs or other terminals to a substrate.

A further object is to provide a method of surface mounting pins, tabs or other terminals without using plastic headers and without requiring holes in the substrate.

The invention is particularly advantageous when used in connection with pin terminals. Other passive components, such as chip resistors, chip capacitors, etc., are readily surface-mounted because of their inherent low height to component area relationships. A pin is very different from a chip in that the columnar relationship L/R (length divided by radius) is very high. Obviously the base of the pin cannot be held in place with an adhesive. The solution in accordance with the invention is to securely hold the pins in exact alignment, using a fixture that travels with the PCB. This is accomplished by mounting the pin-holding fixture on the carriage which carries the PCB nest.

In accordance with the assembly sequence of the invention, the PCB or other substrate is moved through successive work stations. The boards, with previously screened "fingers", i.e. terminals, can be loaded with components already soldered, or with components adhesively attached and awaiting soldering, or without components. In the case of substrates other than boards with terminals plated directly thereon, the pins, tabs or other terminals can be surface-mounted directly on the substrate material.

Although the preferred embodiment will be described hereinafter in connection with the surface-mounting of straight pin terminals on the plated fingers of a printed circuit board, it is to be understood that the invention can also be used to surface-mount straight pin terminals directly on a substrate other than a printed circuit board. Also, other preferred embodiments of the invention can be used to surface-mount bent pin terminals on surfaces. Nor is the applicability of the invention limited to pin terminals. In accordance with the invention, tabs or other types of terminals or contacts can be surface-mounted on a substrate.

In accordance with the preferred embodiment of the invention, the PCBs are loaded onto a nest either manually or automatically through a stack hopper. The nest is in turn movably mounted on a rolling carriage. A plurality of carriages are linked to form a train. The movement of the carriages is controlled by a computerized numerically controlled (CNC) point-to-point controller. This controller drives a stepping motor and lead screw power train which moves the carriages in proper sequence.

The first work station is a solder paste dispenser. The dispenser lays a stripe or dots of solder paste onto a plated "finger" of the PCB, and then the carriage indexes 0.100 inch (or any other predetermined amount depending on the distance between fingers) so that the solder dispenser overlies the next "finger", and the operation is repeated. With the controller it is a simple matter to dispense paste onto any number of fingers. It is also easy to program the controller for voids and for polarized pin patterns. Many different solder paste formulations are available commerically. The assembly machine includes a missing board detector which prevents solder from being dispensed when a nest does not contain a PCB. In an alternative preferred embodiment, the fingers can be screen-printed with a thick coating of solder, whereby the solder paste dispensing step can be eliminated. The elimination of the solder paste dispensing step lengthens the solder reflow time and the entire cycle time.

The second work station is a pin inserter. The pin inserter is mounted on the assembly machine, and operates by receiving pins from a reel of continuous pre-notched pins. Each reel holds 50,000 pins (0.025 inch square). The pin inserter is a standard motorized unit which can insert pins having a round, square or rectangular cross section. Pin lengths can vary from 0.187 to 2.000 inches, and cross sections can range from 0.012 to 0.062 inch. Insertion speeds can range up to 240 pins/-minute. The sequencing of the inserter is programmed by the controller.

The controller signals the pin inserter to actuate, and a pin is inserted into a spring-loaded holding fixture rotatably arranged on each rolling carriage. The carriages move in predetermined increments (or any distance required) and another pin is inserted into the fixture after each incremental advance. When the required number of pins are arranged in the pin-holding fixture, then the carriage is indexed to the next station. While the pins are being inserted at the pin station for subsequent surface mounting on one PCB, solder paste is being dispensed at an earlier station on a different PCB.

After each rolling carriage has traveled past the pin insertion station, a cam rotates the pin-holding fixture through 90 degrees so that in their final position the pins are lying horizontally against the PCB fingers with solder paste therebetween.

From this position the rolling carriage then moves to the next work station. At this work station the PCB nest and the rotated pin-holding fixture are positioned under a heating unit, which may be an infra-red (IR) or hot air heating unit. The programmable time delay during which the PCB and pins are positioned under the heating unit is a function of the type and amount of solder paste as well as the size and number of pins. The heat is focused so that it affects only the PCB area on which the pins are being mounted and not other components that may be mounted on the PCB. The nest and pin-holding fixture travel through additional stations allowing the heated assembly to cool. The pins are then mechanically separated from the pin-holding fixture by the displacement of the nest and the PCB is then removed from the nest, either manually or automatically. This cycle is repeated for each advancement of the carriages to the next station.

All of the foregoing processing steps are automated according to the preferred embodiment of the invention. It is obvious that the loading and unloading of the PCB can be accomplished manually without decreasing the speed with which the automated steps are performed.

Industry requirements include pin terminals that are not only horizontal (parallel to the PCB), but also pins that are offset horizontal and pins that are vertical (perpendicular to the PCB), as shown in FIGS. 2A–2C. These different pin configurations are readily accomplished with the appropriate pin inserter tooling and a suitably modified pin-holding fixture. The versatile pin inserter can cut, form and insert straight or right angle pins directly from a continuous reel of pre-notched pin material.

BRIEF DESCRIPTION OF THE DRAWINGS

The preferred embodiment of the invention will be described in detail with reference to the following drawings:

FIGS. 1A, 1B and 1C show the prior art surface-mounted pin systems already discussed.

FIGS. 2A, 2B and 2C show the aforementioned configurations for surface-mounted pins in accordance with the invention.

FIG. 3 is a block diagram of the looped system for automatic surface mounting of pins according to the preferred embodiments of the invention.

FIG. 5A is a front view of the pin block of the pin-holding fixture.

FIG. 5B is a top view of the pin block of FIG. 5A.

FIG. 5C is an enlarged front view of the channels formed in the pin block of FIG. 5A.

FIG. 5D is a cross-sectional view of the pin block of FIG. 5C taken along the section A—A.

FIG. 6A is a front view of the pin-retaining leaf spring of the pin-holding fixture.

FIG. 6B is a cross-sectional view of the leaf spring of FIG. 6A taken along the section B—B.

DETAILED DESCRIPTION OF THE PREFERRED EMBODIMENTS

Figure 4A:
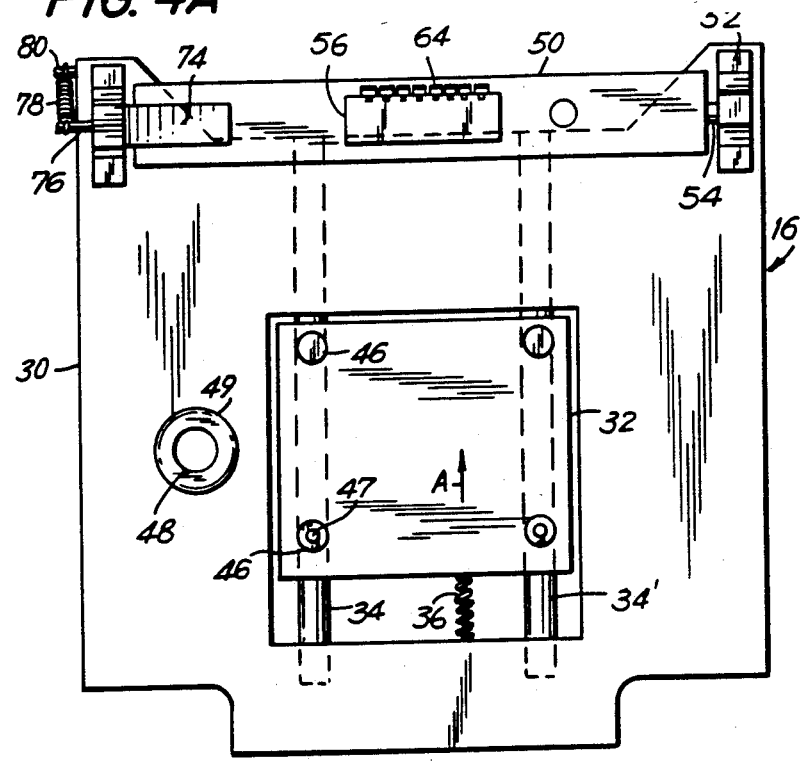
FIG. 4A is a top view of the rolling carriage used in the preferred embodiment for surface-mounting straight pins.

The various surface-mounted pin configurations in accordance with the invention are shown in FIGS. 2A–2C. In FIG. 2A pins are surface-mounted on fingers 3 of printed circuit board (PCB) 2 in a horizontal position. In FIG. 2B one leg of each right-angle bent pin 1' is surface-mounted on a corresponding finger 3 on PCB 2 such that the other leg is vertical. FIG. 2C shows bent pins 1" surface-mounted to produce an offset horizontal arrangement.

The method according to the preferred embodiment of the invention comprises the following steps: (1) applying solder to a plurality of surface areas; (2) holding the pins in precise alignment on the respective surface areas with the solder therebetween; (3) heating the solder to cause solder reflow; and (4) cooling the solder so that a hardened connection is formed between the pins and the surface areas. In the case where the method is being performed automatically, it will also be necessary to include various steps for moving the board from one station to the next station and the steps of loading and unloading the board from the assembly line. The stations for performing the steps of the method according to the invention can be arranged in-line or in a loop.

A detailed description will now be given of the preferred embodiment of the invention in connection with the surface mounting of straight pins on a surface of a PCB. As previously noted, the teachings of this preferred embodiment are equally applicable to substrates other than PCBs, i.e. substrates without plated fingers thereon, as well as terminals other than pins, e.g. tabs. The preferred embodiment of the invention for surface mounting straight pins will be described in connection with a looped or circulating substrate arrangement.

The looped arrangement of the stations is shown in FIG. 3. The PCBs are loaded by a stack hopper 4, although it should be understood that the PCBs can be loaded manually and that the means by which the loading is carried out does not constitute part of the invention.

At the next station, i.e. solder dispenser 6, the solder paste is applied to the plated fingers on the PCB. In an alternative embodiment, the solder paste could be applied on the pins before the pins are brought into contact with the PCB. Further, it is understood that in the case of substrates without plated fingers, the solder paste is applied directly on the substrate material.

After the solder paste has been applied, the pins are inserted by pin insertion machine 8, as will be discussed in detail below. In the preferred embodiment, the pin insertion machine is an Autopin-2, manufactured by Autosplice, Inc., Woodside, New York. This machine is fully disclosed in U.S. Pat. No. 4,318,964, the disclosure of which is incorporated herein by reference.

After the pins have been properly positioned on respective surface areas of the PCB with the solder paste therebetween, the solder paste is heated by heating unit 10 to reflow the solder paste and thereby make a proper soldered connection.

After heating, the solder paste cools as the pins and PCB move to the unloading point. In the preferred embodiment, the PCB with surface-mounted pins is automatically unloaded by unloading unit 12, although it should be understood that the PCBs can also be unloaded manually. The means by which unloading is performed does not constitute part of the invention.

The aforementioned stations are arranged along a closed raceway 14. A train of rolling carriages 16 (only one of which is generally depicted in FIG. 3) travel in the closed raceway 14. The carriages 16 are pivotably connected by links. As will be described in detail below, each carriage has a nest on which a PCB is seated and a fixture for holding an array of pins. The pin-holding fixture is rotatable and not translatable relative to the carriage; the PCB nest is translatable and not rotatable relative to the carriage.

The carriages 16 are driven intermittently by stepping motor 18, having a drive member which engages one carriage, advances it a predetermined amount, disengages from the carriage and returns to its starting point to engage the next carriage. This cycle of steps is performed repeatedly. Since all the carriages are mechanically linked in a looped train, the carriages all advance in unison.

Since, when not engaged by the drive member of the stepping motor 18, the carriages are free-wheeling, their position in relation to the starting point of the drive member must be established before the automated system can operate.

The solder dispenser 6, pin insertion machine 8, heating unit 10 and stepping motor 18 are all controlled in accordance with a program by computerized numeric controller 20. In the preferred embodiment controller 20 is a C62 controller manufactured by Automation Unlimited, Inc. of Woburn, Massachusetts. The solder dispenser, pin insertion machine and heating unit are synchronized to perform their respective functions simultaneously, with respective carriages being located at each station.

Figure 12:
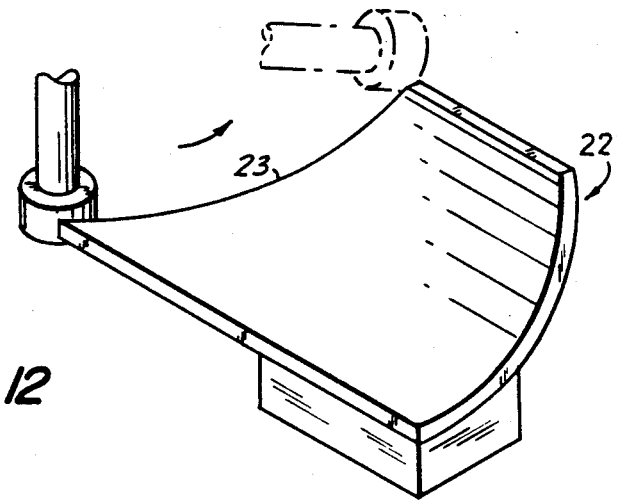
FIG. 12 is a perspective view of the first cam.
Figure 15:
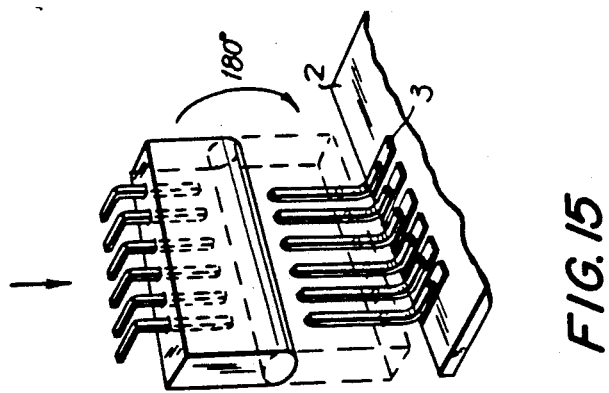
FIG. 15 is a perspective view of the 180° rotation of the pin-holding fixture produced by the first cam in accordance with a preferred embodiment for surface mounting vertical pins.

Between the pin insertion and heating stations, a first cam 22 (see FIG. 12) is provided which rotates the pin-holding fixture 90° relative to the PCB nest. As a result of this rotation, the pins 1 are brought into contact with the fingers 3 on the board 2 with the solder paste therebetween (see FIG. 2A), as will be described in detail below. Obviously in the case where the substrate has no plated fingers, the pin terminals are rotated into direct contact with a surface of the substrate material.

After each PCB with surface-mounted pins is unloaded, a second cam 24 rotates the pin-holding fixture 90° in the opposite direction, thereby returning the pin-holding fixture to its initial position.

The solder dispenser 6 in the preferred embodiment is a 1000XL automatic liquid dispenser manufactured by EFD. Solder dispenser 6 is pneumatically coupled to air supply 28 by way of regulator 26.

The carriage 16 is shown in detail in FIGS. 4A-4D. Carriage 16 comprises a base plate 30 on which the nest 32 for the PCB is slidably mounted by way of rods 34 and 34' connected to base plate 30. The nest 32 is urged in the direction of arrow A by spring 36.

The carriage 16 rides on four rollers 38 (see FIGS. 4B-4D) which are rotatably mounted on respective vertical axles 39. Each roller 38 has a circumferential groove 40 for engaging the corresponding rail 42 (see FIG. 4C). The grooves 40 and rails 42 have V-shaped cross sections. The carriage 16 travels along the rails 42 by rotation of rollers 38.

Figure 4B:
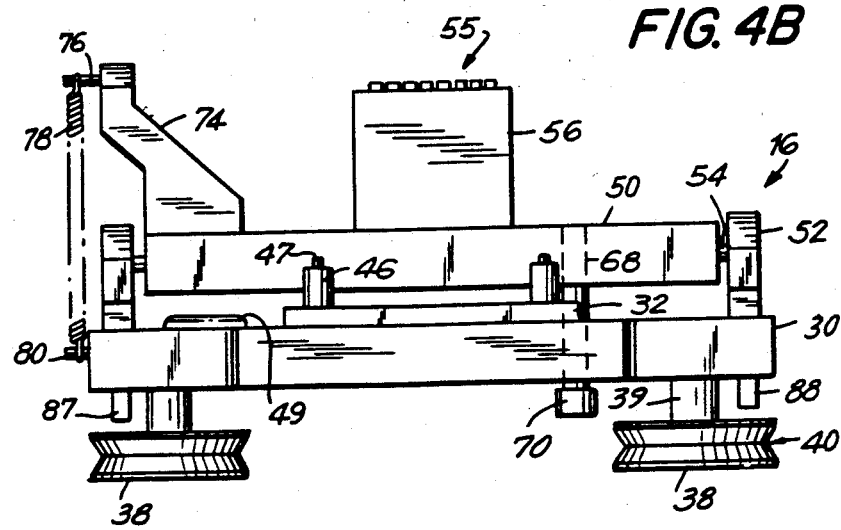
FIG. 4B is a side view of the carriage of FIG. 4A.
Figure 4C:
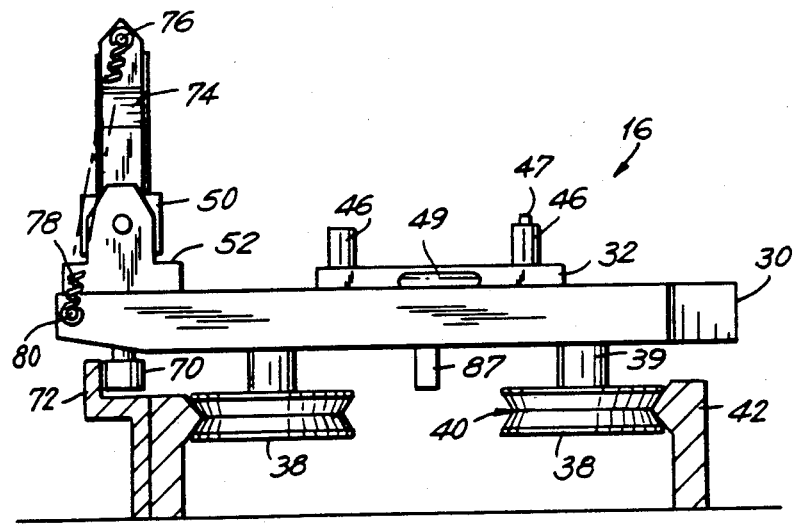
FIG. 4C is a rear view of the carriage of FIG. 4A.
Figure 4D:
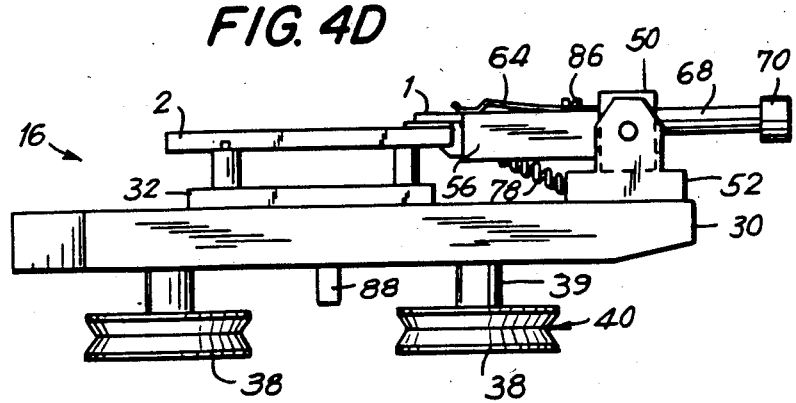
FIG. 4D is a front view of the carriage with the pin-holding fixture rotated 90° relative to the fixture position shown in FIGS. 4A–4C.

The nest 32 has four support pins 46 with horizontal end surfaces on which the PCB rests. Two of the support pins 46 have smaller engagement pins 47 integrally formed on the end surfaces for interlocking in corresponding holes formed in the PCB. The mounted PCB 2 is shown in FIG. 4D.

A hole 48 is formed in the base plate 30 in the rear portion of the carriage, i.e. that portion which trails the nest during circulation of the carriage in the looped raceway. The hole 48 is sized to receive the previously mentioned drive member (element 84 in FIG. 7A, to be discussed in detail hereinafter). The periphery of hole 48 is occupied by a chamfered rim 49, the chamfer being provided to guide the drive member 84 into the hole 48.

A support bar 50 is rotatably supported by way of shafts 54 in bearing blocks 52 fixed on the base plate 30. As best seen in FIG. 4B, the pin-holding fixture 55 is securely mounted on the top surface of bar 50, which has a rectangular cross section. The pin-holding fixture 55 comprises a pin block 56 and a leaf spring 64.

The pin block 56 is shown in detail in FIGS. 5A-5D. In the preferred embodiment, an array of eight grooves 60 are formed in the back face of pin block 56. In the preferred embodiment, the grooves extend in parallel in a direction perpendicular to the axis of rotation of support bar 50. Each groove 60 extends from the top surface of the pin block 56, along the back face for a distance equal to less than the height of the pin terminals to be inserted therein. The width of each groove is substantially equal to the width of the pin terminals to be surface-mounted on the board, except that the grooves have a chamfer 58 in the vicinity of the top surface of the pin block to facilitate entry of the pin during insertion by the pin insertion machine. It is important to note that the depth d of each groove 60 (see FIG. 5D) is less than the depth of the pin inserted therein, for reasons to be discussed in detail hereinafter.

Figure 11:
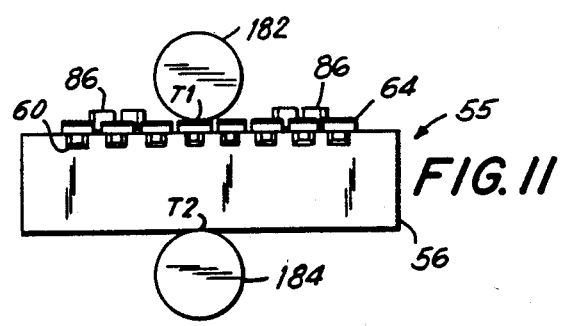
FIG. 11 is a top view of the gripping rollers which engage the pin-holding fixture during pin insertion.

The leaf spring 64, shown in detail in FIGS. 6A and 6B, is bolted to the back face of pin block 56 (see bolts 86 in FIG. 11). Each finger 66 of leaf spring 64 overlies a corresponding one of grooves 60 with pre-stress. When a pin terminal 1 is inserted in one of the grooves 60, the corresponding finger 66 of leaf spring 64 is flexed away from the pin block 58 due to the aforementioned fact that the depth d of the pins is greater than the depth of the grooves 60. Thus, each pin terminal inserted in the pin block 58 by the pin insertion machine 8 is held in the corresponding groove 60 by the resilient urging of the corresponding prestressed finger 66.

Of course, although the preferred embodiment has been described in connection with a pin block having grooves for holding eight pins, it is obvious that the pin block can be designed to hold any predetermined number of pins with any predetermined spacing depending on the pin layout required on the PCB.

Referring again to FIGS. 4A-4D, it can be seen that in addition to the pin-holding fixture 55, the support bar 50 has an extension 74 mounted thereon. A side face of extension 74 has a pin 76 connected thereto, while a side face of base plate 30 also has a pin 80 connected thereto. A biasing spring 78 extends between pins 76 and 80 for urging the extension 74 toward the vertical or horizontal positions, i.e. away from intermediate oblique positions.

The support bar 50 also has a rod 68 securely arranged in a bore formed therein. When the pin-holding fixture is in the upright position, the rod 68 extends in a downward vertical direction. A roller 70 is rotatably mounted on the end of rod 68. As best seen in FIG. 4C, roller 70 abuts restraining rail 72, which serves to prevent clockwise rotation of the support bar 50 when the carriage is located along the portion of track 14 prior to the first cam 22, but after the second cam 24. It should further be noted that counterclockwise rotation of support bar 50 is prevented by abutment of rod 68 against plate 30. When the carriage reaches the first cam 22, the camming surface 23 thereof (see FIG. 12) guides the roller 70 so that the support bar 50 rotates 90° to the position shown in FIG. 4D. This will be discussed further hereinafter.

All of the carriages 16 are connected by links (not shown), each link being pivotably mounted at one end on a pin 87 arranged on the underside of the base plate 30 near the trailing edge of one carriage and pivotably mounted at the other end on a pin 88 arranged on the underside of the base plate 30 near the leading edge of the next following carriage.

The carriages 16 are intermittently driven by a stepping motor 18. The stepping motor is a Slo-Syn type MO620-FD04 manufactured by Superior Electric. The stepping motor 18 is coupled to the carriages by a drive member 84 movably mounted on a mechanical assembly 90 shown in FIG. 7A. The mechanical assembly 90 is slidably mounted on the support block 96 of the stepping motor 18, as shown in FIG. 7B. A sliding surface 92 of sliding block 96 is slidably seated in channel 94 formed on support block 98. Sliding surface 92 and channel 94 each have V-shaped cross sections.

In the preferred embodiment, the mechanical assembly 90 is coupled to the stepping motor 18 by means of a worm gear train (not shown). Before the mechanical assembly 90 is driven in the direction indicated by arrow C in FIG. 7A, the drive member 84 must be inserted in hole 48 of the underlying carriage. When this interlocking has been accomplished, driving of the mechanical assembly 90 in direction C by the worm gear train (not shown) will displace the underlying carriage in the same direction, thereby causing all of the carriages to advance. The distance advanced will depend on the length of the travel path of the mechanical assembly 90.

Figure 7A:
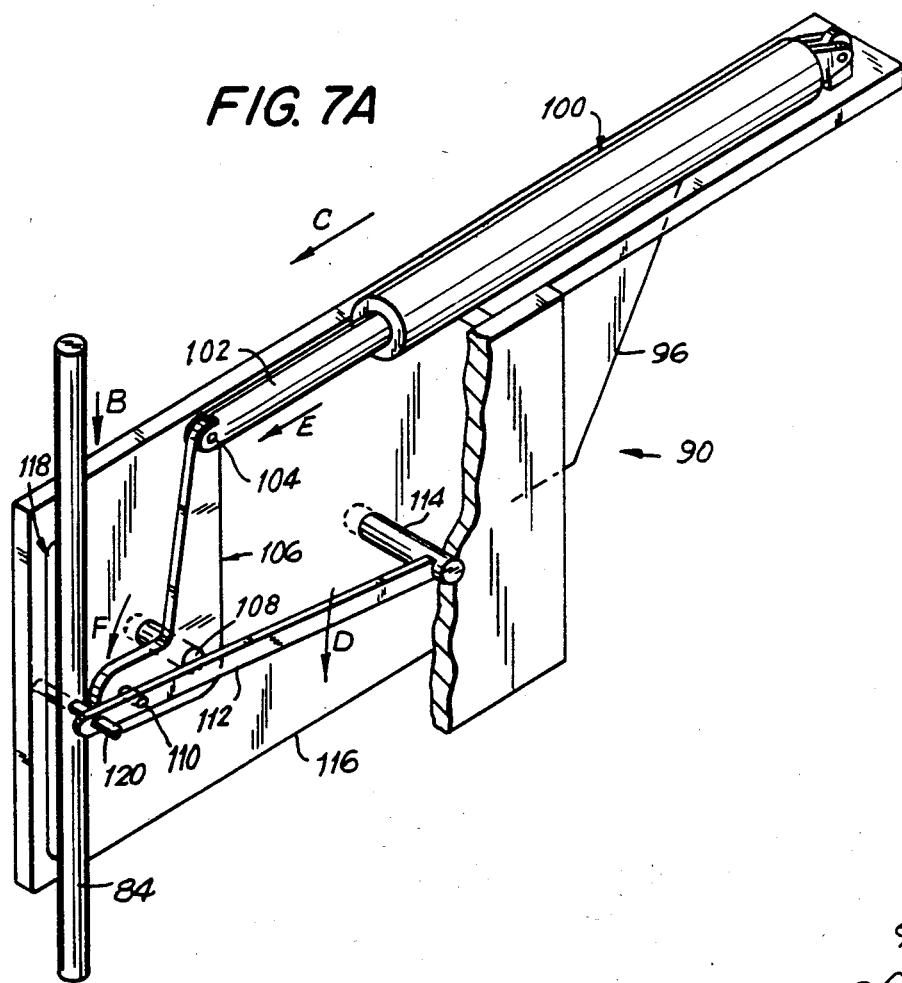
FIG. 7A is a perspective view of the mechanism by which the stepping motor advances the linked carriages along the loop.
Figure 7B:
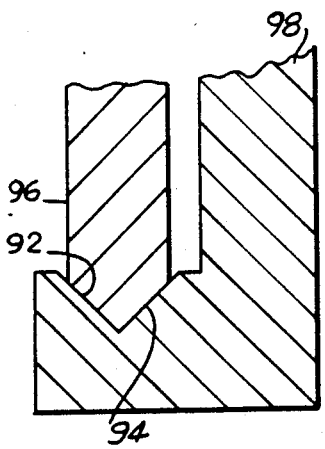
FIG. 7B is an end view of the portion of the mechanism of FIG. 7A which slidably engages the support block of the stepping motor.

In order for drive member 84 to engage hole 48 of the underlying carriage, the drive member 84 is displaced in the downward direction (indicated by arrow B in FIG. 7A). This is accomplished by activating a piston-cylinder arrangement 100, which is securely mounted on the sliding block 96. In response to a signal from controller 20 (see FIG. 3), the piston arranged inside the cylinder and the shaft 102 connected thereto move in the direction indicated by arrow E. A pin 104 at the end of shaft 102 is pivotably connected to one arm of an L-shaped member 106, which is in turn pivotably mounted on a fixed pin 108, i.e. a pin rigidly connected to housing 116 of mechanical assembly 90. Housing 116 is also rigidly connected to sliding block 96. Only part of the housing 116 is depicted in FIG. 7A. The other arm of L-shaped member 106 is pivotably connected to a pin 110 fixed to rigid member 112. One end of rigid member 112 is in turn mounted on a fixed pin 114. Fixed pin 114 is pivotably mounted in housing 116. A pin 120, rigidly connected to the other end of rigid member 112 and pivotably connected to drive member 84, is slidably guided in vertical slot 118 formed in housing 116. Finally, drive member 84 passes through a hole in an upper wall of housing 116 and a hole in a lower wall of housing 116, both of which holes are not shown in FIG. 7A. Drive member 84 is held in a substantially vertical position by these holes and is slidably guided thereby for displacement in the vertical direction.

Thus, in response to displacement of shaft 102 in direction E, L-shaped member 106 pivots about pin 108 in direction F, rigid member 112 pivots about pin 114 in direction D, and drive member 84 is vertically displaced in direction B, i.e. the tip of drive member 84 engages hole 48 if hole 48 is properly aligned therebelow. It should be noted that sufficient play is provided between slot 118 and pin 120 and between drive member 84 and the holes (not shown) in housing 116 through which drive member 84 passes to enable the free movement of these parts without jamming.

After the drive member 84 is interlocked in hole 48, the step displacement of mechanical assembly 90 in direction C in response to rotation of the worm gear train (not shown) will advance all of the carriages by the length of the step. At the end of a cycle of advancing steps, the drive member 84 is disengaged from hole 48 and the mechanical assembly 90 is returned to its starting position, whereat drive member 84 will engage hole 48 of the next carriage and the cycle of advancing steps is repeated.

Figure 9A:
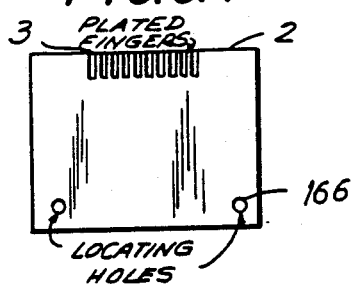
FIG. 9A is a top view of a typical PCB with plated fingers.

As previously mentioned in connection with the description of FIGS. 4A-4D, PCB 2 is loaded onto a carriage 16 by inserting the two pins 47 into corresponding holes 166 in the PCB (see FIG. 9A). The underside of the PCB lies on the end surfaces of the four pins 46, which end surfaces are coplanar.

Figure 8:
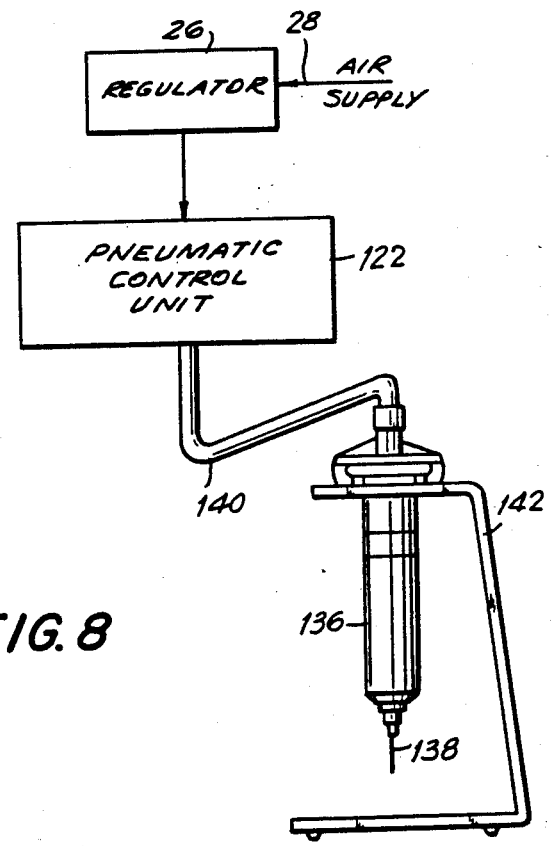
FIG. 8 shows the solder paste dispenser.

After the PCB 2 has been loaded onto the nest, the carriages are moved intermittently until the loaded carriage reaches the soldering station. The solder dispenser 6 includes a pneumatic control unit 122 connected to a barrel reservoir 136, as shown in FIG. 8. As previously mentioned, the pneumatic control unit is a model 1000XL manufactured by EFD. However, it is obvious to one of ordinary skill in the art that other automatic solder paste dispensers could be used. The barrel reservoir 136 is supported by a barrel storage stand 142. The solder is dispensed by dispensing tip 138 of barrel reservoir 136 in response to pressure in hose 140. The pressure in line 140 is controlled by pneumatic control unit 122 in a manner well known in the art.

Plant air is provided to regulator 26 (see FIG. 3) at a pressure of 125 psi. The regulator 26 is connected to the pneumatic control unit 122 for supplying regulated plant air thereto. The output from regulator 26 to the pneumatic control unit 122 is a maximum pressure of 100 psi. When preset air pressure from the pneumatic control unit 122 flows out to the barrel reservoir 136 via hose 140 (see FIG. 8), the air pressure pushes the solder paste out through the dispensing tip 138.

Figure 9B:
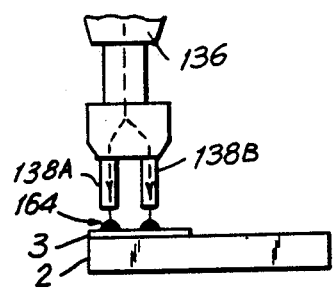
FIG. 9B is a side view of the solder dispensing step.
Figure 9C:
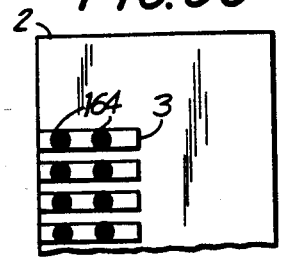
FIG. 9C is a top view of a portion of the PCB with solder dispensed on the plated fingers.

Although FIG. 8 shows only one dispensing tip, in the preferred embodiment of the invention a pair of dispensing tips 138A, 138B dispense solder paste from the barrel reservoir 136 (see FIG. 9B). Each dispensing tip deposits a drop 164 of solder paste on a plated finger 3 of the PCB 2 simultaneously. Solder paste is deposited on the plurality of plated fingers in sequence, one finger at a time. As a result a pair of drops 164 of solder paste are arranged on each finger 3.

After drops of solder paste have been applied to each finger on the board, the carriage is moved to the next station, i.e. to a position underlying the pin insertion machine.

Figure 10:
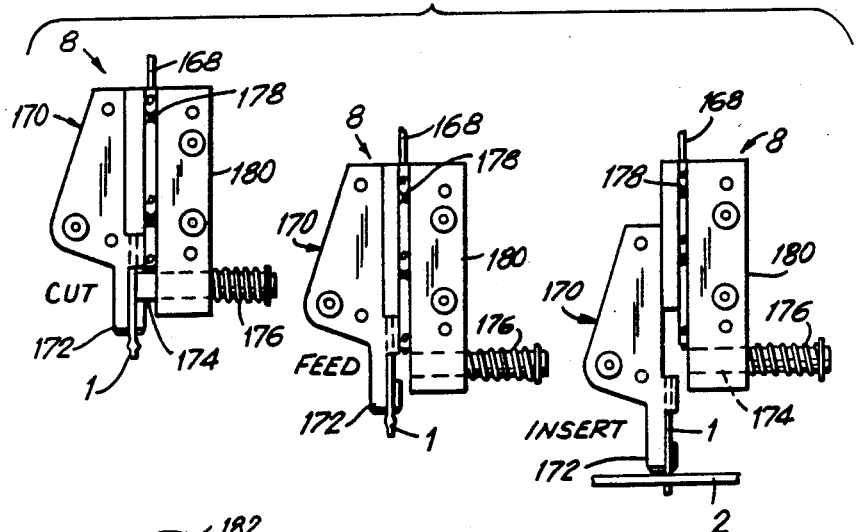
FIG. 10 shows the tooling of the pin insertion machine during three stages of pin insertion.

The steps of the pin insertion are depicted in FIG. 10. The pin insertion machine 8 receives a wire 168 from a supply reel. This wire has been formed into a series of notched pins. The pin insertion machine is adapted to cut off one pin at a time from the last notch of the wire and then drive the pin in a vertical downward stroke. Because such a pin insertion machine is well known, only a portion of the machine will be described herein.

The leftmost portion of FIG. 10 shows the cutting step. The wire 168 is feed through a wire guide 178 formed in support block 180 in successive steps. After each step the leading pin of the wire is located in a predetermined position in front of the cutter 174. A tool 170 comprising two halves (only one of which is shown in FIG. 10) has opposing jaws 172 for receiving the leading pin in the next step. The jaws 172 are urged toward each other by a spring (not shown). When the cutter 174 is driven toward the wire, cutter 174 severs the leading pin from the wire and forces it between the separated spring-loaded jaws 172. Spring 176 urges the cutter 174 back to its withdrawn position, as shown in the center portion of FIG. 10. Then the tool 170 performs a downward stroke (by means not shown), with the pin 1 being inserted by the jaws 172 into a hole (as shown in the rightmost portion of FIG. 10), which hole is customarily located in a printed circuit board.

In the preferred embodiment according to the invention, however, the pin is not inserted into a hole formed in a PCB, but rather is inserted into one of the grooves 60 in the pin block 58. The pin is displaced along its own axis and in a direction parallel to the longitudinal axis of the groove during the downward stroke of the tooling 170. Because the depth of the pins is greater than the depth of the grooves, the corresponding finger 66 of leaf spring 64 is flexed away from pin block 58 when a pin is inserted in the receiving groove.

As previously mentioned, the pin force-fit between jaws 172 is held in the jaws by frictional forces. In order to remove the pin from the jaws, these frictional forces must be overcome by the pin-holding fixture. The frictional force produced by the leaf spring finger as it urges the pin against the wall of the groove, however, is not sufficient by itself to overcome the frictional forces produced by the jaws. To solve this problem, a pair of pressing rollers 182 and 184 are arranged on opposing sides of pin block 58, as shown in FIG. 11. Rollers 182 and 184 are arranged such that the line of contact T1 of roller 182 with pin block 58 and the line of contact T2 of roller 184 with leaf spring 64 (lines which are perpendicular to the plane of FIG. 11) lie in a plane perpendicular to the direction of translation of pin block 58 during carriage advancement. Furthermore, the axis of the pin in the jaws 172 lies in the plane of lines T1 and T2. The distance between the lines T1 and T2 is such that the leaf spring finger between the rollers is pressed against the pin in the groove with sufficient force to produce a frictional force between the pin and the groove/finger assembly which is greater than the frictional force between the pin and the jaws 172. Thus, the pin is gripped by the pressed finger and opposing wall of the groove such that the pin remains in the groove when the tooling 170 of the pin insertion machine performs its upward return stroke (not shown), i.e. the pin is pulled out of the jaws 172 by the pin-holding fixture.

These steps are repeated for each successive pin from wire 168 until each groove 60 of pin block 58 has a pin inserted therein. Although the preferred embodiment is described in connection with a board on which a row of eight pins are to be surface-mounted, it is obvious that any number of pins can be surface-mounted on the board provided that the controller 20 is suitably programmed and the pin-holding fixture is suitably designed in dependence on the size of the printed circuit board and the number of pins. The pin inserter can be programmed through the controller to skip stations, where required.

Figure 13:
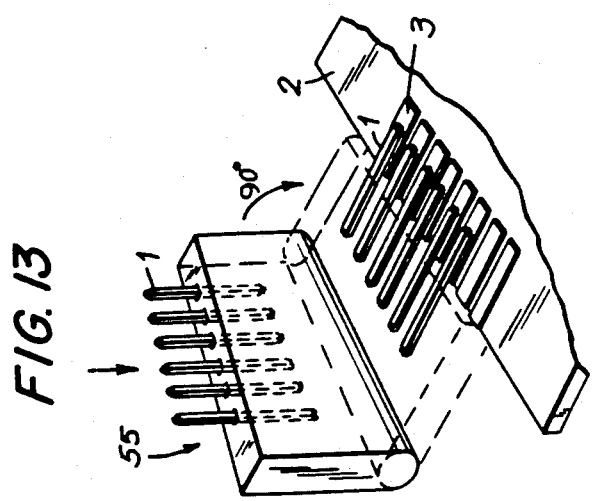
FIG. 13 is a perspective view of the 90° rotation of a pin-holding fixture produced by the first cam of FIG. 12.

After pins have been inserted in all of the grooves 60 of pin block 58, the carriages 16 are advanced by the stepping motor 18 under the control of the controller 20. When the cam follower 70 reaches the first cam 22 located at the end of restraining rail 72, the cam follower rides along a curved camming surface 23 (see FIG. 12). The camming surface 23 and cam follower 70 are arranged such that as the carriage continues to advance, the pin-holding fixture 55 is rotated 90° (see FIG. 13). As the result of this rotation, the ends of the pins 1 protruding from the pin block are brought into contact with the fingers 3 on the PCB 2.

Figure 14:
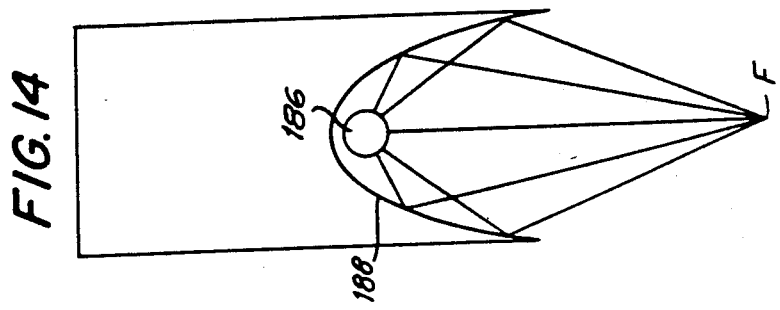
FIG. 14 is a side view of the infra-red heating station.

The carriages continue to advance until the carriage passing the first cam 22 reaches the heating unit 10. The heating unit according to the preferred embodiment has a source of infra-red radiation 186 and a reflector 188 having a parabolic cross section (see FIG. 14). The infra-red source 186 is turned on and off under the control of the program of the controller. When the infra-red source 186 is turned on, the infra-red radiation is focused at a focal line which extends perpendicular to the page of FIG. 14 and is denoted by F. The heat applied to the solder paste locations results in the reflow of the solder between the pins 1 and the PCB 2. After the solder paste has been heated sufficiently, the heating unit is switched off. At the appropriate time the carriages are again advanced under the control of controller 20.

It is to be understood that all of the carriages are advanced intermittently. After each advance, the stations each perform their functions simultaneously. In the actual working embodiment, twelve carriages circulate in the loop and eight pins were surface-mounted on each board. Necessarily during each circuit, each carriage advances according to a cycle comprising seven incremental steps followed by one large step, these eight steps being repeated twelve times during each circuit. The seven incremental steps correspond to the advances made by the carriages as the pins are inserted in succession in one carriage and as the solder paste is applied to successive fingers in the next carriage, whereas the large step corresponds to the advances made by the carriages as the carriage at the solder dispensing station moves to the pin insertion machine.

The controller 20 carries out the foregoing cycle in accordance with a stored program. This program does not form part of the invention and will not be discussed further here. The writing of a suitable program for use in a computerized numeric controller based on the given system parameters is deemed to be a task easily performed by one of ordinary skill in the art.

The foregoing description of the preferred embodiments is presented for illustrative purposes only and is not intended to limit the scope of the invention as defined in the appended claims. Modifications may be readily effected by one having ordinary skill in the art without departing from the spirit and scope of the invention concept herein disclosed.

What is claimed is:

1. Apparatus for manufacturing electronic parts including a mechanism for surface mounting a plurality of terminals on a corresponding plurality of surface areas of a substrate, said substrate having discrete solder means applied on each of said plurality of surface areas, comprising:
   (a) a rail having first and second work stations arranged therealong, said first work station comprising a terminal-inserting means and said second work station comprising a heating means, said terminal-inserting means being located before said heating means in the direction of carriage travel along said rail,
   (b) a first carriage arranged to travel along said rail, said first carriage comprising a nest for receiving and supporting said substrate,
   (c) a rotatable terminal-holding means on said first carriage for receiving and supporting said plurality of terminals, said terminal-holding means having a first angular position when said first carriage is located at a position along said rail adjacent to said terminal-inserting means and a second angular position when said first carriage is located at a position along said rail adjacent to said heating means, said first angular position being different than said second angular position, said terminal-holding means being configured to hold said plurality of terminals by only one end leaving exposed a predetermined length at the opposite end, whereby said terminals contact the solder means applied on said substrate when said terminal-holding means is in said second angular position,
   (d) camming means having a camming surface and arranged along said rail between said terminal-inserting means and said heating means for rotating said terminal-holding means from said first angular position to said second angular position, said first carriage further comprising a cam follower connected to said terminal-holding means and an axle about which said terminal-holding means rotates, said cam follower being guided by the camming surface on said camming means during travel of said carriage past said camming means, whereby said terminal-holding means rotates from said first angular position to said second angular position.

2. Apparatus for manufacturing electronic parts including a mechanism for surface mounting a plurality of terminals on a corresponding plurality of surface areas of a substrate, said substrate having discrete solder means applied on each of said plurality of surface areas, comprising:
   (a) a rail having first and second work stations arranged therealong, said first work station comprising a terminal-inserting means and said second work station comprising a heating means, said terminal-inserting means being located before said heating means in the direction of carriage travel along said rail,
   (b) a first carriage arranged to travel along said rail, said first carriage comprising a nest for receiving said substrate,
   (c) a rotatable terminal-holding means for receiving said plurality of terminals, said terminal-holding means comprising a block having a plurality of grooves for respectively receiving a plurality of terminals by only one end leaving exposed a predetermined length at the opposite end, and a spring means connected to said block with prestress, said spring means having a plurality of fingers,
   (d) said terminal-inserting means comprising a pair of jaws for gripping each terminal in succession by application of frictional forces and a pair of rollers arranged to press a finger of said spring means against a terminal inserted by said jaws in a corresponding one of said plurality of grooves, the frictional forces applied to said inserted terminal by said spring means and said block when said rollers press said spring means against said block being greater than the frictional forces applied to said inserted terminal by said jaws, whereby said inserted terminal is removed from said jaws when said jaws are displaced away from said terminal-holding means.

3. Apparatus for manufacturing electronic parts including a mechanism for surface mounting a plurality of terminals on a corresponding plurality of surface areas on a flat side surface area of a substrate, said substrate having discrete solder means applied on each of said plurality of surface areas, comprising:
   first and second work stations arranged along a given path and a first carriage arranged to travel along said given path,
   said first carriage comprising means for supporting said substrate with said solder means exposed and extending substantially in a given plane and terminal-holding means for releasably receiving and holding a plurality of terminals each by only one end and leaving exposed and free a predetermined length at the opposite end,
   said first work station comprising means for inserting discrete terminals into said terminal-holding means, and said second work station comprising heating means, said first work station being located before said second work station in the direction of carriage travel along said path,
   means connected to said terminal-holding means for rotating same from a first terminal-receiving position facing said terminal-inserting means to a second position wherein portions of the terminals extend parallel to the plane of the solder means and contact the solder means along side surfaces of the terminals,
   and means for causing the first carriage to follow the given path.

4. The apparatus as defined in claim 3, wherein said first carriage comprises a nest for receiving said substrate.

5. The apparatus as defined in claim 4, wherein said terminal-holding means of said first carriage has a first angular position when said first carriage is located at a position along said path adjacent to said terminal-inserting means and a second angular position when said first carriage is located at a position along said path adjacent to said heating means, said first angular position being different than said second angular position.

6. The apparatus as defined in claim 5, wherein said substrate and said plurality of terminals are respectively supported by said nest and said terminal-holding means, whereby said terminals contact the solder means applied on said substrate when said terminal-holding means is in said second angular position.

7. The apparatus as defined in claim 5, wherein said terminal-holding means is rotated from said first angular position to said second angular position by a camming means arranged along said path between said terminal-inserting means and said heating means, said camming means having a camming surface.

8. The apparatus as defined in claim 3, wherein said heating means comprises a source of infra-red radiation.

9. The apparatus as defined in claim 3, further comprising a second carriage mechanically linked to said first carriage to form a train.

10. The apparatus as defined in claim 3, wherein said path is in the form of a loop.

11. The apparatus as defined in claim 3, further comprising a stepping means and a movable coupling means for linking said stepping means and said first carriage, whereby said first carriage is advanced along said path in response to displacement of said stepping means when said coupling means is engaged in said first carriage.

12. The apparatus as defined in claim 23, wherein said terminal-inserting means, said heating means, and said stepping means are synchronized by a central control means.

13. The apparatus as defined in claim 3, further comprising solder dispensing means capable of applying said solder means on said surface areas of said substrate when said first carriage is positioned adjacent thereto, said solder dispensing means being located before said terminal-inserting means in the direction of carriage travel along said path.

14. Apparatus as claimed in claim 3, wherein said substrate-supporting means is capable of translation but incapable of rotation relative to the first carriage, and said terminal holding means is capable of rotation but incapable of translation relative to the first carriage.

15. A method of manufacturing electronic parts including a method of surface mounting a plurality of relatively stiff terminals on a corresponding plurality of conductive surface areas on a flat side surface area of a substrate for soldering thereto, said surface areas lying in substantially a first plane, said substrate having discrete solder means applied on a first portion of each of said plurality of surface areas, comprising the following steps:
 (a) supporting said substrate such that said solder means are oriented in a given plane,
 (b) providing a holder for releasably receiving said terminals in parallel terminal-receiving regions,
 (c) inserting discrete terminals into the terminal-receiving regions such that free ends of the terminals project outwardly from the holder in parallel directions which are not parallel to the given plane in which the solder means are oriented, said terminals being aligned in such manner that when said terminal holder and substrate support are in juxtaposition and relative rotation of the terminal holder and the substrate support occurs, side surfaces of the terminal free ends become aligned with the solder means,
 (d) rotating the terminal holder and substrate support relative to one another until side surfaces of the free ends of the terminals contact the solder means,
 (e) while the terminals are held in contact with the solder means as per step (d), heating the solder means to produce reflow and wetting of the terminal free ends, followed by cooling of the solder means to provide soldered connections between each of the terminal side surfaces and respective ones of the solder means, and
 (f) separating said terminal holder and substrate support to release the terminals from the holder to allow the substrate with soldered terminals to be removed.

16. A method of manufacturing electronic parts as claimed in claim 15, wherein step (f) is carried out by translating in one direction the terminal holder and support relative to one another.

17. A method of manufacturing electronic parts as claimed in claim 15 wherein solder means is also applied on a second portion of each of said plurality of surface areas, said terminals also contacting the solder means on said second portion of said plurality of surface areas when placed in contact with the solder means on said first portions.

18. A method of manufacturing electronic parts as claimed in claim 15, wherein said terminals are pins each having a substantially linear portion which are parallel to said substrate surface when in contact with the solder means.

19. A method of manufacturing electronic parts as claimed in claim 15 wherein the terminals are pins, the substrate is a printed circuit board, the terminal-receiving regions of the holder are spring-loaded, the terminal holder and substrate support are mounted on common support means with the terminal holder rotatable relative to the common support means and the substrate support translatable relative to the common support means.

20. A method of manufacturing electronic parts as claimed in claim 19 wherein the terminal holder is rotated 90 degrees to bring the free ends of the terminals into contact with the solder means.

21. The method as defined in claim 15, wherein said plurality of terminals are held substantially stationary and in proper alignment during heating of the solder means.

* * * * *